United States Patent
Kim

(10) Patent No.: US 7,324,574 B2
(45) Date of Patent: Jan. 29, 2008

(54) LONG WAVELENGTH VERTICAL CAVITY SURFACE EMITTING LASER WITH MONOLITHICALLY GROWN PHOTODETECTOR

(75) Inventor: Taek Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 51 days.

(21) Appl. No.: 10/846,521

(22) Filed: May 17, 2004

(65) Prior Publication Data
US 2005/0041714 A1    Feb. 24, 2005

(30) Foreign Application Priority Data
Aug. 19, 2003    (KR)  ............ 10-2003-0057283

(51) Int. Cl.
*H01S 5/00* (2006.01)

(52) U.S. Cl. ............ 372/50.21; 372/50.124

(58) Field of Classification Search ............ 372/50.11, 372/50.124, 50.21, 99
See application file for complete search history.

(56) References Cited

U.S. PATENT DOCUMENTS

| | | | |
|---|---|---|---|
| 5,475,701 A * | 12/1995 | Hibbs-Brenner | 372/50.124 |
| 5,892,786 A * | 4/1999 | Lott | 372/50.124 |
| 5,943,357 A | 8/1999 | Lebby et al. | |
| 6,023,485 A * | 2/2000 | Claisse et al. | 372/50.21 |
| 2003/0021322 A1* | 1/2003 | Steinle et al. | 372/50 |
| 2003/0103543 A1* | 6/2003 | Moser et al. | 372/96 |

* cited by examiner

*Primary Examiner*—Armando Rodriguez
(74) *Attorney, Agent, or Firm*—Buchanan Ingersoll & Rooney PC

(57) ABSTRACT

A long wavelength vertical cavity surface emitting laser (VCSEL) with a monolithically-grown photodetector is provided. The photodetector is installed in a middle portion of or on a bottom surface of a lower distributed Bragg reflector of the long wavelength VCSEL. The photodetector is integrated with the long wavelength VCSEL. A substrate on which the long wavelength VCSEL and the photodetector are crystal-grown does not absorb a laser beam emitted from the long wavelength VCSEL. Thus, the laser beam heading toward the substrate is accurately detected, and the gain of the laser beam is effectively controlled.

15 Claims, 4 Drawing Sheets

LONG WAVELENGTH VERTICAL CAVITY SURFACE EMITTING LASER WITH MONOLITHICALLY GROWN PHOTODETECTOR

This application claims the priority of Korean Patent Application No. 2003-57283, filed on Aug. 19, 2003, in the Korean Intellectual Property Office, the disclosure of which is incorporated herein in its entirety by reference.

BACKGROUND OF THE INVENTION

1. Field of the Invention

The present invention relates to a long wavelength vertical cavity surface emitting laser (VCSEL) with a monolithically grown photodetector.

2. Description of the Related Art

Generally, a VCSEL diode is combined with a photodetector for power monitoring and automatic power control (APC) based on the power monitoring. For example, in U.S. Pat. No. 5,943,357, a photodetector is attached to a long wavelength VCSEL by wafer fusion.

FIG. 1 is a simplified cross-section of a conventional VCSEL to which a photodetector is fused. Referring to FIG. 1, the conventional VCSEL includes an upper semiconductor layer 12 of distributed Bragg reflectors (DBR), an active region 11, and a lower semiconductor layer 13 of DBRs, which are sequentially deposited on a substrate (not shown). The active region 11 is a cavity where laser resonance occurs. A PIN photodetector 20 is fused or bonded to a bottom of the VCSEL having such a configuration.

As described above, a photodetector, for example, a PIN photodetector, is attached to a bottom of a VCSEL with a long wavelength of 1300 to 1600 nm and monitors the power output of the VCSEL. Typically, the attaching technique may be a wafer bonding, a wafer fusion, or a transparent metal adhesion.

Wafer fusion is not suitable for mass-production because of process-related problems. Also, wafer fusion causes a voltage drop at the interface between a photodetector and a VCSEL. As a result, the amount of input voltage must be increased.

A disadvantage of the conventional VCSEL is that a photodetector cannot accurately detect only the output of the VCSEL because both spontaneous emission and a beam emitted from the VCSEL reach the photodetector.

Referring to FIG. 2, both light generated from spontaneous emission and a laser beam emitted from an active region of a conventional VCSEL come out of the active region. Since the structure of the VCSEL is substantially the same as that of a resonant cavity light emitting diode (LED), the spontaneous emission is directed in all directions.

When a VCSEL is designed so that a beam heading for an upper part of the VCSEL can be used as an output, DBRs of a lower semiconductor layer of the VCSEL have higher refractive indices than those of an upper semiconductor layer thereof. Accordingly, the intensity of a laser beam heading for a lower part of the VCSEL is relatively lower than that of the beam heading for the upper part of the VCSEL. Because a laser beam emitted from a VCSEL typically has a diameter of about 10 μm but spontaneous emission is directed in all direction, the intensity of the laser beam is higher than that of the spontaneous emission at a specific area of a photodetector where the laser beam passes (i.e., at an area with an approximately 10 μm diameter located directly down a center of the VCSEL). However, the percentage of spontaneous emission received by the entire area of the photodetector is quite high. Particularly, this feature appears in the VCSEL shown in FIGS. 1 and 2, to a bottom surface of which a light-receiving surface with an about 200-300 μm width of the photodetector 20 is bonded so as to receive light from the VCSEL.

In a short wavelength VCSEL with a monolithically-grown photodetector, the photodetector must be attached to an upper surface of the short wavelength VCSEL because, if the photodetector is attached to a bottom surface of the VCSEL, a substrate corresponding to the base of the VCSEL absorbs a laser beam emitted from the VCSEL and accordingly cannot monitor the exact power output of the VCSEL.

SUMMARY OF THE INVENTION

The present invention provides a long wavelength vertical cavity surface emitting layer (VCSEL) with a monolithically-grown photodetector, which can be easily fabricated and effectively monitor a laser beam emitted from the long wavelength VCSEL.

The long wavelength VCSEL comprises a semiconductor substrate, a lower distributed Bragg reflector, which includes multiple layers and is grown on the semiconductor substrate, an active region, which includes multiple semiconductor material layers and is grown on the lower distributed Bragg reflector, and an upper distributed Bragg reflector, which includes multiple layers and is grown on the active region. The lower distributed Bragg reflector layer includes a photodetector which detects a laser beam emitted from the active region that heads for the semiconductor substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
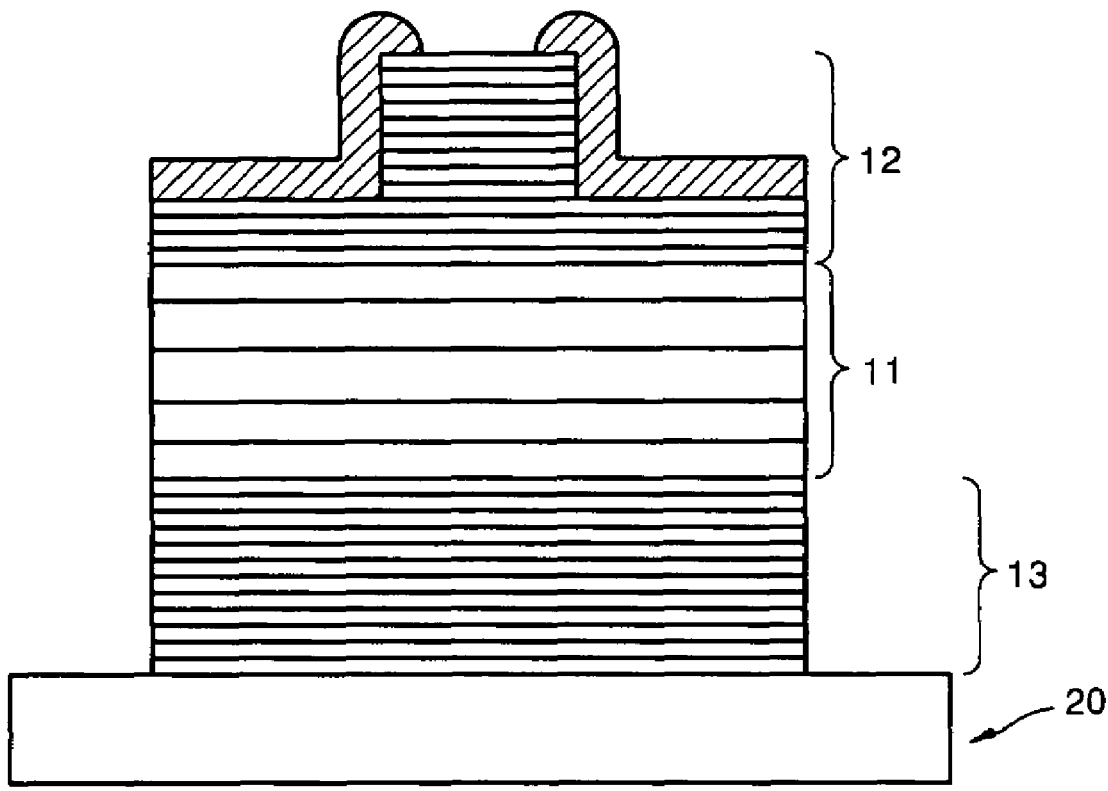
FIG. 1 is a simplified vertical cross-section of a conventional vertical cavity surface emitting laser (VCSEL) with a photodetector.
Figure 2:
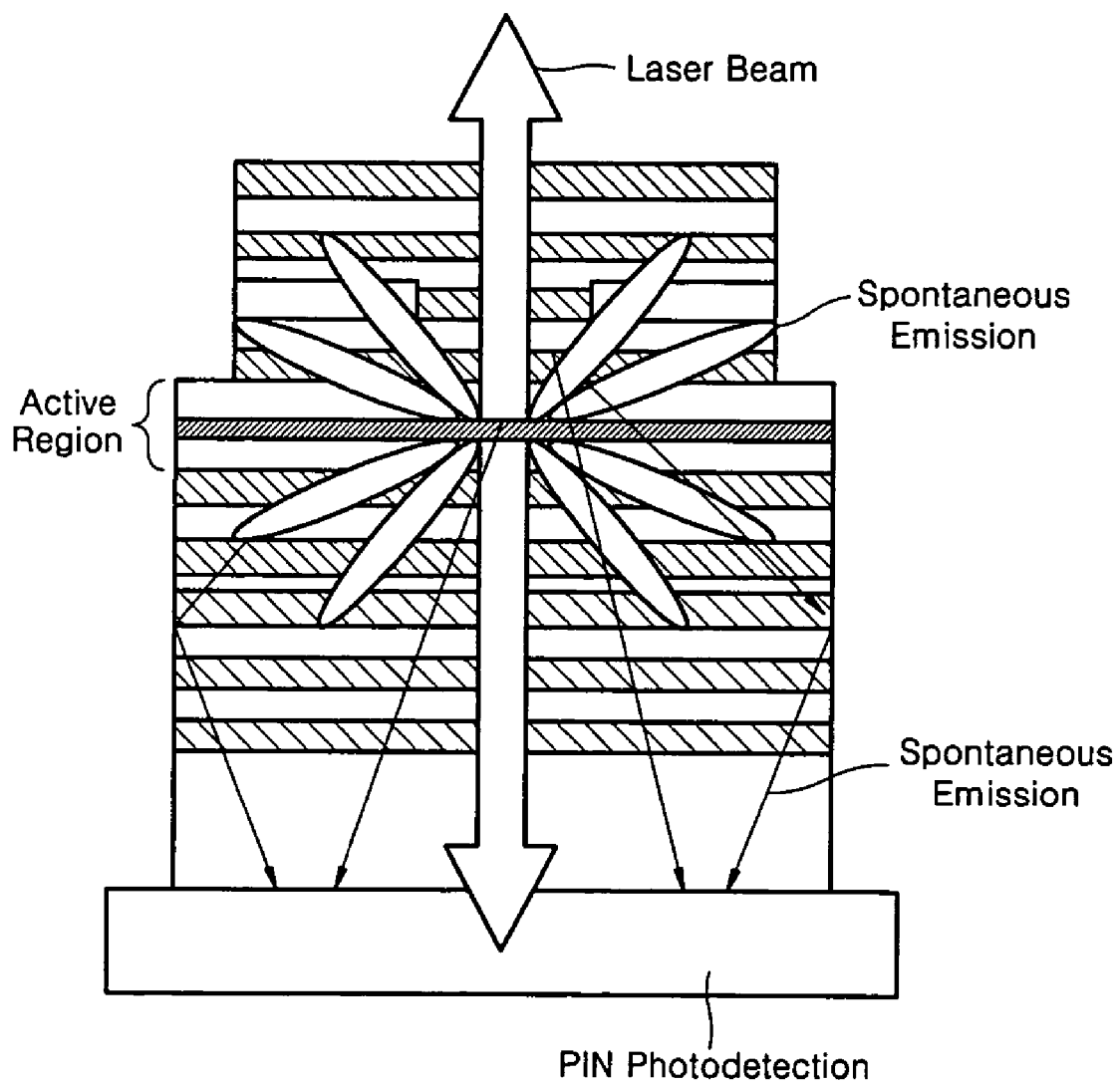
FIG. 2 illustrates a flow of a laser beam and spontaneous emission from a conventional VCSEL to a photodetector.
Figure 3:
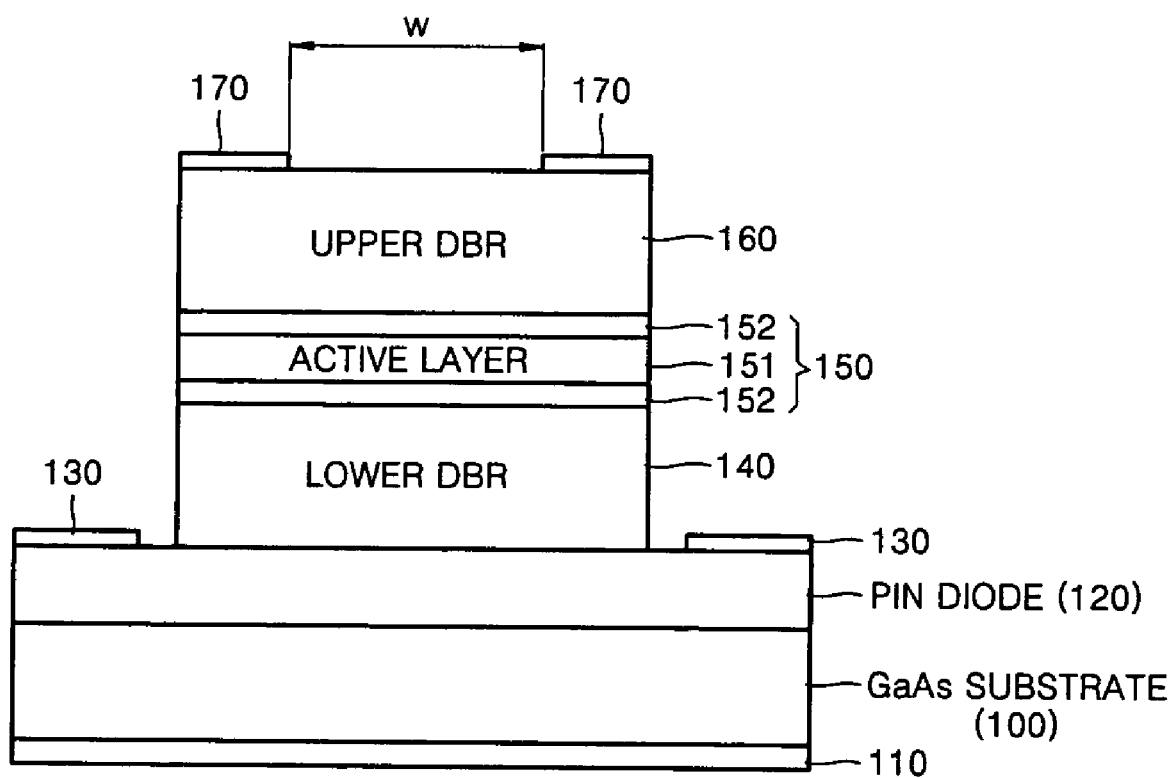
FIG. 3 is a simplified vertical cross-section of a vertical cavity surface emitting laser (VCSEL) with a photodetector according to a first embodiment of the present invention.

In a first embodiment of FIG. 3, a PIN diode 120, which is a photodetector, has an (Al)GaAs/absorbing layer/(Al)GaAs stack structure and is crystal grown on a gallium arsenide (GaAs) substrate 100, and a lower metal electrode 110 is formed on a bottom surface of the substrate 100. The absorbing layer includes one of an InGaAs quantum well, an indium gallium arsenide nitride (InGaAsN) quantum well, and an In(Ga)(N)As quantum dot wherein the band gap of the absorbing layer is less or same that of the following active layer 151.

An intermediate metal electrode 130 is formed on each of both shoulders of the PIN diode 120. A lower distributed Bragg reflector (DBR) 140, which is a component of a vertical cavity surface emitting laser (VCSEL), has a GaAs/AlAs or AlGaAs/AlGaAs stack structure, that is, an (Al)

GaAs/Al(Ga)As stack structure, and is grown on an upper surface of a middle portion of the PIN diode 120.

An active region 150 including two cladding layers 152 and an active layer 151 sandwiched between the cladding layers 152 is grown on the lower DBR 140. The active layer 151 includes one of an indium gallium arsenide (InGaAs) quantum well, an indium gallium arsenide nitride (InGaAsN) quantum well, and an In(Ga)(N)As quantum dot, and two barrier layers respectively formed on upper and lower surfaces of the selected quantum well or dot.

An upper DBR 160 having a GaAs/AlAs or AlGaAs/AlGaAs stack structure, that is, an (Al)GaAs/Al(Ga)As stack structure, is grown on the active region 150.

Two upper metal electrodes 170 are formed on the upper DBR 160 such as to be respectively located at both sides of a middle area (w) through a laser beam passes.

In this particular embodiment, the PIN diode 120 exists beneath the lower DBR 140. Alternatively, the PIN diode 120 may be formed within a middle portion of the lower DBR 140. In other words, the PIN diode 120 may be grown together with the lower DBR 140.

Figure 4:
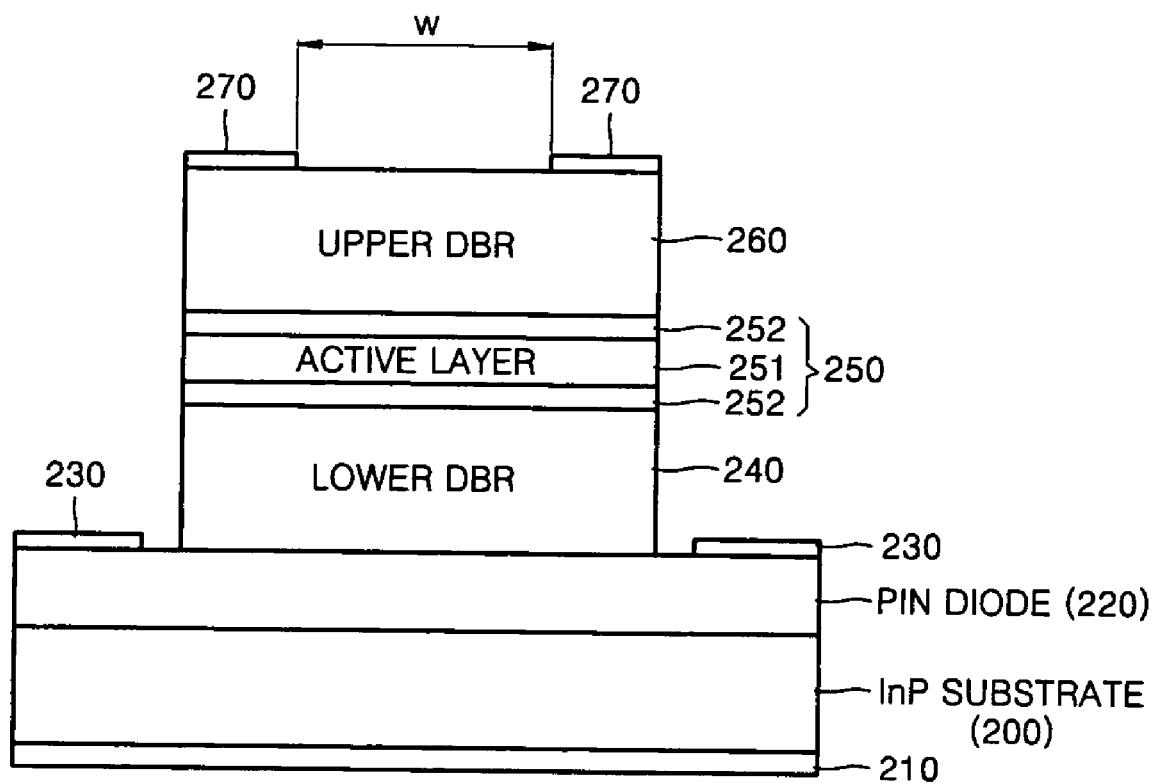
FIG. 4 is a simplified vertical cross-section of a vertical cavity surface emitting laser (VCSEL) with a photodetector according to a second embodiment of the present invention.

In a second embodiment of FIG. 4, a PIN diode 220, which is a photodetector, has an InP/absorbing layer/InP stack structure and is crystal-grown on an indium phosphide (InP) substrate 200, and a lower metal electrode 210 is formed on a bottom surface of the substrate 200. The absorbing layer includes one of an InGaAsP quantum well, an InGaAlAs quantum well, an InGaAs quantum well, an In(Ga)(N)As quantum dot, and an AlGaAsSb quantum well wherein the band gap of the absorbing layer is less or same as that of the following active layer 251.

If a substrate on which a photodetector is grown is formed of InP as in the second embodiment, it is preferable that an active region includes one of an InGaAsP quantum well, an InGaAlAs quantum well, an InGaAs quantum well, an In(Ga)(N)As quantum dot, and an aluminium gallium arsenide stibium (AlGaAsSb) quantum well.

An intermediate metal electrode 230 is formed on each of both shoulders of the PIN diode 220. A lower DBR 240, which is a component of a VCSEL, has an InP/InGaAsP or InP/InGaAlAs stack structure and is grown on an upper surface of a middle portion of the PIN diode 220.

An active region 250 including two cladding layers 252 and an active layer 251 sandwiched between the cladding layers 252 is grown on the lower DBR 240. The active layer 251 includes one of an InGaAsP quantum well, an InGaAlAs quantum well, an InGaAs quantum well, an In(Ga)(N)As quantum dot, and an AlGaAsSb quantum well, and two barrier layers respectively formed on upper and lower surfaces of the selected quantum well or dot.

An upper DBR 260 having an InP/InGaAsP or InP/InGaAlAs stack structure is grown on the active region 250.

Two upper metal electrodes 270 are formed on the upper DBR 260 such as to be respectively located at both sides of a middle area (w) through which a laser beam passes.

In this particular embodiment, the PIN diode 220 exists beneath the lower DBR 240. However, the PIN diode 220 may be formed within a middle portion of the lower DBR 240. In other words, the PIN diode 220 may be grown together with the lower DBR 240.

As described above, in the present invention, a photodetector is installed between an active region of a VCSEL and a substrate, that is, at an area where a non-used laser beam passes. Hence, an actually used laser beam does not decrease. In this structure, when a laser beam with a long wavelength travels toward the substrate, absorption of the laser beam by the substrate is much reduced, and accordingly, precise detection and gain control of the laser beam are possible. However, In the case of short wavelength VCSELs, absorption of a laser beam by a substrate is inevitable, which makes accurate photodetection difficult.

The VCSEL of the present invention can be fabricated by first sequentially growing a lower DBR, an active region, and an upper DBR on a photodetector that is grown on a substrate, thereafter exposing a part of the photodetector by etching, and then forming an intermediate metal electrode. The intermediate metal electrode is shared by the photodetector and the VCSEL.

A resultant column shape of the VCSEL on the photodetector helps reduce a phenomenon in which spontaneous emission is absorbed by the photodetector and creates noise. Hence, as shown in FIGS. 3 and 4, the VCSEL of the present invention is preferably in the shape of a column with a smaller width than the photodetector 120 or 220 by exposing both shoulders of the photodetector 120 or 220 on the substrate 100 or 200. According to this structure, light coming out of a lower DBR is received by a photodiode located below the lower DBR and detected by the photodiode.

In the present invention, a substrate on which a long wavelength VCSEL and a photodetector are monolithically crystal-grown does not absorb a laser beam with a long wavelength emitted from the long wavelength VCSEL because an energy bandgap of the substrate is greater than the long wavelength. For example, the above-described substrate used in the present invention is a GaAs or InP substrate.

The VCSEL of the present invention is applicable to any field in which a long wavelength laser is used, such as, to a field of optical communications.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A long wavelength vertical cavity surface emitting laser configuration comprising:
   a semiconductor substrate;
   a photodetector located on said semiconductor;
   a lower distributed Bragg reflector, which includes multiple layers and is grown on the photodetector;
   an active region, which includes multiple semiconductor material layers which emit long wavelength light upon excitation and is grown on the lower distributed Bragg reflector; and
   an upper distributed Bragg reflector, which includes multiple layers and is grown on the active region,
   wherein the photodetector detects a laser beam emitted from the active region that heads toward semiconductor substrate,
   wherein both shoulders of the photodetector are exposed so that a stack including the lower distributed Bragg reflector, the active region, and the upper distributed Bragg reflector has a column shape on the photodetector, and
   wherein the photodetector comprises a PIN photodiode having a p-doped layer, an n-doped layer and an absorbing layer, and further comprising at least one upper photodiode formed on the upper distributed Bragg reflector, at least an intermediate electrode formed on the PIN electrode, and a lower electrode formed on a bottom surface of the semiconductor substrate, said lower electrode being shared by the active region and the PIN photodiode.

2. The long wavelength vertical cavity surface emitting laser configuration of claim 1, wherein the substrate is made of gallium arsenide (GaAs).

3. The long wavelength vertical cavity surface emitting laser configuration of claim 1, wherein the substrate is made of indium phosphide (InP).

4. The long wavelength vertical cavity surface emitting laser configuration of claim 1, wherein the substrate is made of one of GaAs and InP.

5. The long wavelength vertical cavity surface emitting laser configuration of claim 1, wherein the substrate is made of GaAs, and the active region is made of an InGaAs quantum well layer.

6. The long wavelength vertical cavity surface emitting laser of claim 1, wherein the substrate is made of GaAs, and the active region is made of one of an indium gallium arsenide nitride (InGaAsN) quantum well layer, and an In(Ga)(N)As quantum dot layer.

7. The long wavelength vertical cavity surface emitting laser of claim 1, wherein the substrate is made of GaAs, and an absorbing layer of the photo detector includes one of an InGaAs quantum well, an indium gallium arsenide nitride (InGaAsN) quantum well, and an In(Ga)(N)As quantum dot.

8. The long wavelength vertical cavity surface emitting laser configuration of claim 1, wherein each of the upper and lower distributed Bragg reflectors is an (Al)GaAs/Al(Ga)As stack.

9. The long wavelength vertical cavity surface emitting laser configuration of claim 4, wherein each of the upper and lower distributed Bragg reflectors is an (Al)GaAs/Al(Ga)As stack.

10. The long wavelength vertical cavity surface emitting laser configuration of claim 1, wherein the substrate is made of InP, and the active region is made of an InGaAsP quantum well layer.

11. The long wavelength vertical cavity surface emitting laser configuration of claim 1, wherein the substrate is made of InP, and the active region is made of one of an InGaAlAs quantum well layer, an InGaAs quantum well layer, an In(Ga)(N)As quantum dot layer, and an aluminum gallium arsenide stibium (AlGaAsSb) quantum well layer.

12. The long wavelength vertical cavity surface emitting laser configuration of claim 1, wherein the substrate is made of InP, and an absorbing layer of the photo detector includes one of an InGaAsP quantum well, an InGaAlAs quantum well, an InGaAs quantum well, an In(Ga)(N)As quantum dot, and an AlGaAsSb quantum well.

13. The long wavelength vertical cavity surface emitting laser configuration of claim 10, wherein each of the upper and lower distributed Bragg reflectors is an InP/InGaAsP or InP/InGaAlAs stack.

14. The long wavelength vertical cavity surface emitting laser configuration of claim 11, wherein each of the upper and lower distributed Bragg reflectors is an InP/InGaAsP or InP/InGaAlAs stack.

15. The long wavelength vertical cavity surface emitting laser configuration of claim 1, wherein the absorbing layer has a band gap that is less than or the same as that of the active layer.

* * * * *